(12) United States Patent
Cho

(10) Patent No.: US 7,910,443 B2
(45) Date of Patent: Mar. 22, 2011

(54) METHOD INVOLVING TRIMMING A HARD MASK IN THE PERIPHERAL REGION OF A SEMICONDUCTOR DEVICE

(75) Inventor: Yun-Seok Cho, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 437 days.

(21) Appl. No.: 11/983,075

(22) Filed: Nov. 6, 2007

(65) Prior Publication Data

US 2008/0160738 A1 Jul. 3, 2008

(30) Foreign Application Priority Data

Dec. 27, 2006 (KR) .......................... 10-2006-0134293

(51) Int. Cl.
*H01L 21/8234* (2006.01)
*H01L 21/3205* (2006.01)
*H01L 21/4763* (2006.01)

(52) U.S. Cl. .................. 438/275; 438/585; 257/E21.206

(58) Field of Classification Search .................. 438/275, 438/585; 257/E21.206
See application file for complete search history.

(56) References Cited

U.S. PATENT DOCUMENTS

| 6,833,596 B2 * | 12/2004 | Matsuo .......................... 257/412 |
| RE38,914 E * | 12/2005 | Jang et al. ...................... 438/638 |
| 7,109,101 B1 * | 9/2006 | Wright et al. .................. 438/585 |
| 2004/0185623 A1 * | 9/2004 | Su et al. .......................... 438/275 |
| 2005/0142497 A1 * | 6/2005 | Ryou et al. ..................... 430/311 |
| 2005/0285204 A1 * | 12/2005 | Kim et al. ...................... 257/368 |
| 2005/0287809 A1 * | 12/2005 | Lee et al. ....................... 438/689 |
| 2008/0166876 A1 * | 7/2008 | Jung ............................. 438/684 |

FOREIGN PATENT DOCUMENTS

| CN | 1632921 A | 6/2005 |
| CN | 1722409 A | 1/2006 |
| CN | 1879201 A | 12/2006 |
| KR | 10-2005-0070320 | 7/2005 |

* cited by examiner

*Primary Examiner* — Matthew C Landau
*Assistant Examiner* — Daniel Luke
(74) *Attorney, Agent, or Firm* — Blakely, Sokoloff, Taylor & Zafman LLP

(57) ABSTRACT

A method for fabricating a semiconductor device includes forming a conductive material layer for forming a gate over a substrate including a cell region and a peripheral region, forming hard mask patterns over the conductive material layer, forming a mask pattern over the resultant structure in the cell region, exposing the peripheral region, trimming the hard mask patterns in the peripheral region, removing the mask pattern, and etching the conductive material layer to form gate patterns using the hard mask patterns.

7 Claims, 3 Drawing Sheets

METHOD INVOLVING TRIMMING A HARD MASK IN THE PERIPHERAL REGION OF A SEMICONDUCTOR DEVICE

CROSS-REFERENCE TO RELATED APPLICATIONS

The present invention claims priority to Korean patent application number 2006-0134293, filed on Dec. 27, 2006, which is incorporated by reference in its entirety.

BACKGROUND OF THE INVENTION

The present invention relates to a method for fabricating a semiconductor device, and more particularly, to a method for forming a gate pattern in a semiconductor device.

During a typical process for forming a gate pattern in a dynamic random access memory (DRAM), a critical dimension (CD) of a peripheral region is formed small to form a high speed device. However, it is difficult to exclusively decrease the CD of the peripheral region. Pattern densities in a cell region and the peripheral region are different from each other. The patterns in the peripheral region have various shapes. Thus, decreasing the CD smaller than a certain size is difficult.

Currently, various methods including optical proximity correction (OPC), lithography, and etch are used for decreasing the CD of the peripheral region.

However, there may be a limitation in decreasing the CD of the peripheral region when performing the OPC method using a scattering bar. The lithography method may cause a notching or a collapse when overly decreasing the CD. The etch method can decrease the CD by adjusting a bias. However, the OPC, the lithography, and the etch methods adjust the CD in both the cell region and the peripheral region at substantially the same time. Thus, it is difficult to decrease the CD of the peripheral region exclusively while uniformly maintaining the CD of the cell region.

Thus, a method for decreasing the CD of the peripheral region exclusively while uniformly maintaining the CD of the cell region may be required.

SUMMARY OF THE INVENTION

Embodiments of the present invention are directed to provide a method for fabricating a semiconductor device, which can selectively decrease a critical dimension (CD) of a peripheral region while uniformly maintaining a CD of a cell region when forming a gate pattern.

In accordance with an aspect of the present invention, there is provided a method for fabricating a semiconductor device. The method includes forming a conductive material layer for forming a gate over a substrate including a cell region and a peripheral region, forming hard mask patterns over the conductive material layer, forming a mask pattern over the resultant structure in the cell region, exposing the peripheral region, trimming the hard mask patterns in the peripheral region, removing the mask pattern, and etching the conductive material layer to form gate patterns using the hard mask patterns.

DESCRIPTION OF SPECIFIC EMBODIMENTS

Embodiments of the present invention relate to a method for fabricating a semiconductor device.

FIGS. 1A to 1F are cross-sectional views of a method for fabricating a semiconductor device in accordance with an embodiment of the present invention.

Figure 1A:
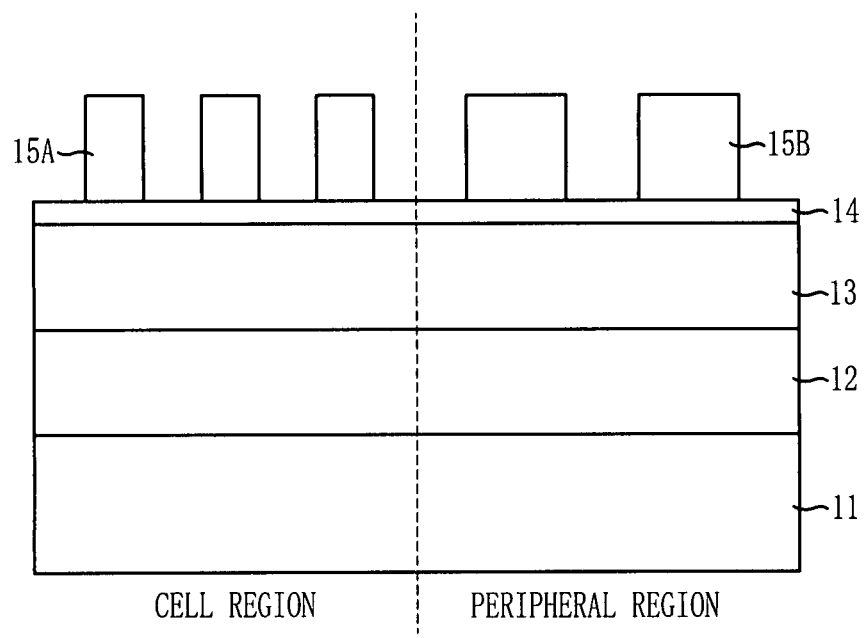
FIGS. 1A to 1F are cross-sectional views of a method for forming a semiconductor device in accordance with an embodiment of the present invention.

Referring to FIG. 1A, a conductive material layer 12 for forming a gate is formed over a substrate 11 including a cell region and a peripheral region. The substrate 11 may include a semiconductor substrate on which a dynamic random access memory (DRAM) process is performed. Although not shown, a gate oxide layer may be formed over the substrate 11 before forming the conductive material layer 12. Also, the conductive material layer 12 may include a single layer or multiple layers. A gate hard mask nitride layer may be formed over the conductive material layer 12.

A first hard mask layer 13 is formed over the conductive material layer 12. The first hard mask layer 13 is formed to be used as a hard mask to etch the conductive material layer 12. The first hard mask layer 13 may include a carbon (C)-based material. For instance, the carbon-based material includes an amorphous carbon or a carbon polymer. Also, the carbon-based material is formed using a chemical vapor deposition (CVD) method.

A second hard mask layer 14 is formed over the first hard mask layer 13. The second hard mask layer 14 is formed to be used as a hard mask to etch the first hard mask layer 13. The second hard mask layer 14 may include a silicon (Si)-based material. The Si-based material may include a polymer comprising one of silicon oxynitride (SiON), silicon oxide ($SiO_2$), and Si.

First photoresist patterns are formed over the second hard mask layer 14. The first photoresist patterns formed in the cell region are represented with reference numeral 15A, and the first photoresist patterns formed in the peripheral region are represented with reference numeral 15B. Hereinafter, the first photoresist patterns 15A formed in the cell region are referred to as the first cell photoresist patterns 15A, and the first photoresist patterns 15B formed in the peripheral region are referred to as the first peripheral photoresist patterns 15B.

That is, the first cell photoresist patterns 15A and the first peripheral photoresist patterns 15B are formed over the second hard mask layer 14. The first cell photoresist patterns 15A and the first peripheral photoresist patterns 15B are formed to define a gate pattern region. The first cell photoresist patterns 15A and the first peripheral photoresist patterns 15B are formed by forming a photoresist layer over the second hard mask layer 14 and patterning the photoresist layer to define the gate pattern region using a photo-exposure and a development process. Gate pattern critical dimensions (CD) in the cell region and the peripheral are different from each other. Thus, the first cell photoresist patterns 15A and the first peripheral photoresist patterns 15B are patterned with different CDs.

Figure 1B:
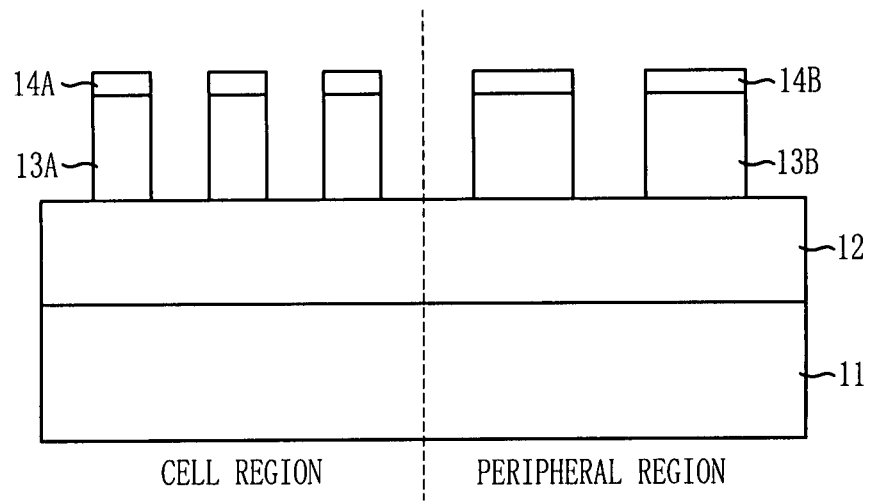

Referring to FIG. 1B, the second hard mask layer 14 and the first hard mask layer 13 are etched using the first cell photoresist patterns 15A and the first peripheral photoresist patterns 15B. The second hard mask layer 14 is etched using the first cell photoresist patterns 15A and the first peripheral photoresist patterns 15B. The first hard mask layer 13 is etched using the etched second hard mask layer 14.

The etched first and second hard mask layers 13 and 14 are patterned to have different CDs in the cell region and the peripheral region. This result is obtained because the CDs of the first cell photoresist patterns 15A and the first peripheral photoresist patterns 15B are different in the cell region and the peripheral region, and pattern densities in the cell region and the peripheral region are different.

Hereinafter, the patterned first hard mask layer 13 in the cell region is referred to as first cell hard mask patterns 13A and the patterned first hard mask layer 13 in the peripheral region is referred to as first peripheral hard mask patterns 13B. Also, the patterned second hard mask layer 14 in the cell region is referred to as second cell hard mask patterns 14A and the patterned second hard mask layer 14 in the peripheral region is referred to as second peripheral hard mask patterns 14B.

The first cell photoresist patterns 15A and the first peripheral photoresist patterns 15B are removed by the time the first cell hard mask patterns 13A, the first peripheral hard mask patterns 13B, the second cell hard mask patterns 14A, and the second peripheral hard mask patterns 14B are formed, or the first cell photoresist patterns 15A and the first peripheral photoresist patterns 15B are removed through an additional removal process.

Figure 1C:
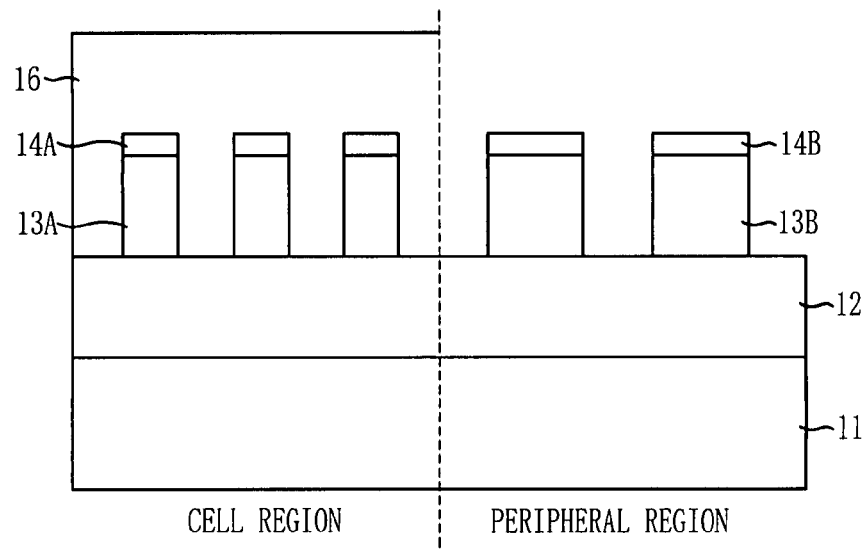

Referring to FIG. 1C, a second photoresist pattern 16 is formed over the second cell hard mask patterns 14A in the cell region, exposing the peripheral region. The second photoresist pattern 16 is formed by forming a photoresist layer over the resultant structure including the second cell hard mask patterns 14A and the second peripheral hard mask patterns 14B and patterning the photoresist layer to expose the peripheral region using a photo-exposure and a development process. The second photoresist pattern 16 is formed to a sufficient thickness such that the first cell hard mask patterns 13A and the second cell hard mask patterns 14A are not exposed when the photoresist layer loses a certain thickness during a subsequent trimming process.

Thus, the second photoresist pattern 16 is formed to expose the first peripheral hard mask patterns 13B and the second peripheral hard mask patterns 14B while protecting the first cell hard mask patterns 13A and the second cell hard mask patterns 14A.

Figure 1D:
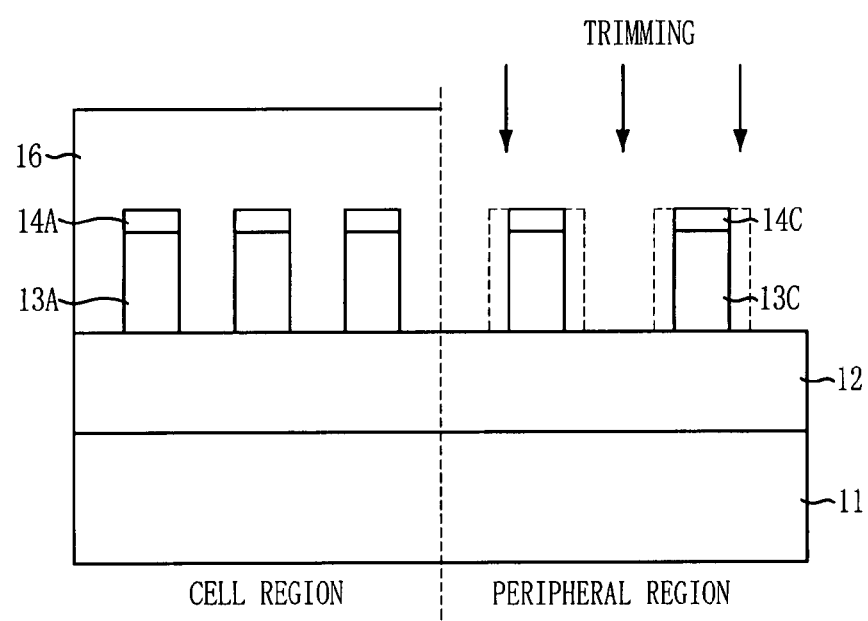

Referring to FIG. 1D, a trimming process is performed on both the first peripheral hard mask patterns 13B and the second peripheral hard mask patterns 14B. The trimming process uses oxygen ($O_2$) or a plasma of a gas including $O_2$.

The first cell hard mask patterns 13A and the second cell hard mask patterns 14A are covered with the second photoresist pattern 16. Thus, the CD of the peripheral region is selectively trimmed to adjust to a desired width while maintaining the CD of the cell region.

Hereinafter, the trimmed first peripheral hard mask patterns 13B are referred to as trimmed first peripheral hard mask patterns 13C, and the trimmed second peripheral hard mask patterns 14B are referred to as trimmed second peripheral hard mask patterns 14C.

Figure 1E:
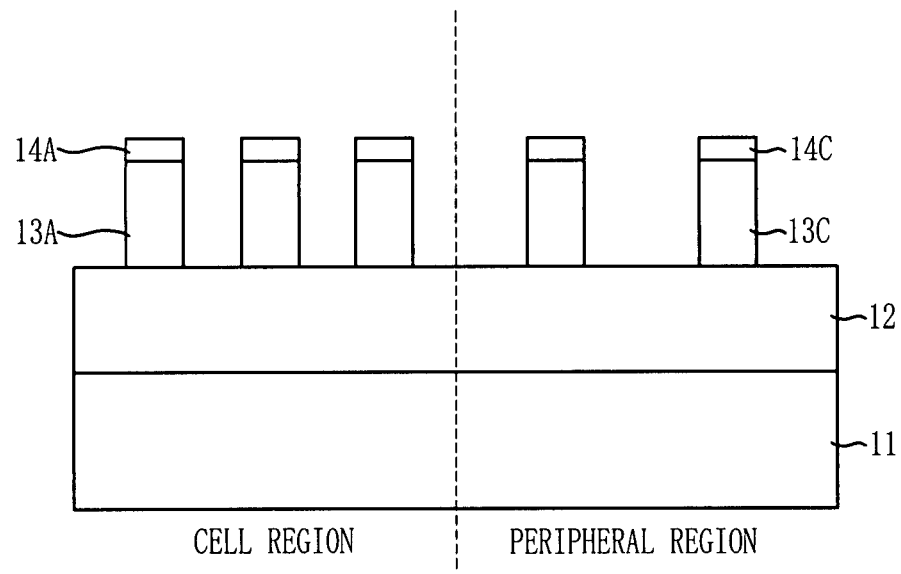

Referring to FIG. 1E, the second photoresist pattern 16 is removed. The second photoresist pattern 16 is removed using a wet etch process to selectively remove the second photoresist pattern 16 and not the first cell hard mask patterns 13A and the trimmed first peripheral hard mask patterns 13C. The wet etch process may be performed using a solution including sulfuric acid ($H_2SO_4$) and hydrogen peroxide ($H_2O_2$). For instance, piranha solution including sulfuric acid (30%) and hydrogen peroxide (70%) and having a temperature of approximately 125° C. is used.

The second photoresist pattern 16 is removed by the wet etch process because the carbon-based material may be removed during an oxygen removal process using a dry etch. Thus, the cell region maintains the first cell hard mask patterns 13A and the second cell hard mask patterns 14A are maintained to have a final inspection CD (FICD) which is substantially the same as a development inspection CD (DICD). At substantially the same time, the first peripheral hard mask patterns 13B and the second peripheral hard mask patterns 14B are trimmed selectively to form a FICD smaller than the patterned CD, i.e., the DICD.

Figure 1F:
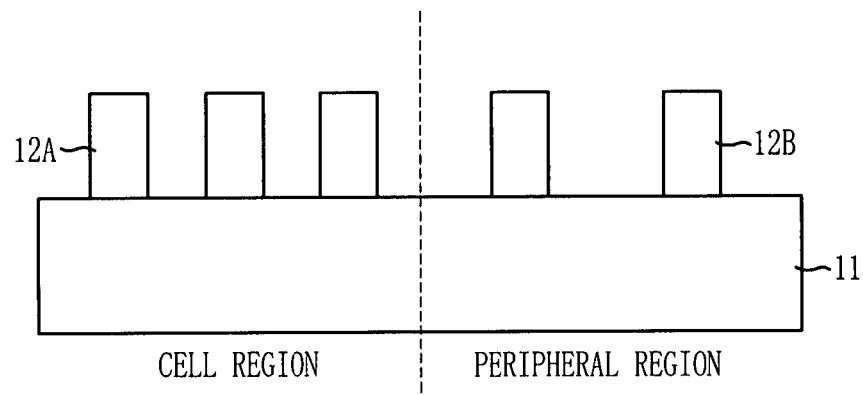

Referring to FIG. 1F, the conductive material layer 12 is etched using the first cell hard mask patterns 13A, the trimmed first peripheral hard mask patterns 13C, the second cell hard mask patterns 14A, and the trimmed second peripheral hard mask patterns 14C to form first gate patterns 12A and second gate patterns 12B.

When the first gate patterns 12A and the second gate patterns 12B are formed, the second cell hard mask patterns 14A and the trimmed second peripheral hard mask patterns 14C are removed. Also, portions of the first cell hard mask patterns 13A and the trimmed first peripheral hard mask patterns 13C may be removed or the cell hard mask patterns 13A and the trimmed first peripheral hard mask patterns 13C may remain after the first gate patterns 12A and the second gate patterns 12B are formed.

The first cell hard mask patterns 13A and the trimmed first peripheral hard mask patterns 13C are removed. The first cell hard mask patterns 13A and the trimmed first peripheral hard mask patterns 13C including the carbon-based material are removed by a dry etch process. For instance, an $O_2$ removal process is used. Thus, the first gate patterns 12A and the second gate patterns 12B are formed while uniformly maintaining the CD in the cell region and selectively decreasing the CD in the peripheral region.

According to this invention, the first cell hard mask patterns 13A, the first peripheral hard mask patterns 13B, the second cell hard mask patterns 14A, and the second peripheral hard mask patterns 14B are formed, the second photoresist pattern is formed to selectively expose the peripheral region while protecting the first cell hard mask patterns 13A and the second cell hard mask patterns 14A, and the first peripheral hard mask patterns 13B and the second peripheral hard mask patterns 14B are trimmed to form the gate patterns by maintaining the CD of the cell region and selectively decreasing the CD of the peripheral region.

According to this invention, the gate patterns are formed by uniformly maintaining the CD of the cell region and selectively decreasing the CD of the peripheral region, positively affecting the research on high speed devices.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising: forming a conductive material layer over a substrate including a cell region and a peripheral region; forming hard mask patterns over the conductive material layer in the cell region and the peripheral region; forming a mask pattern over the substrate including the hard mask patterns only in the cell region, exposing the peripheral region; trimming the hard mask patterns in the peripheral region without using a mask formed over the hard mask patterns in the peripheral region so that the critical dimension of the hard mask patterns in the peripheral region is reduced; removing the mask pattern; and etching the conductive material layer to form gate patterns using the hard mask patterns in the cell region and the trimmed hard mask patterns in the peripheral region, wherein the hard mask patterns comprise a stack structure including a carbon (C)-based material and a silicon (Si)-based material including a polymer, wherein the polymer includes one selected from a group consisting of silicon oxide ($SiO2$) and Si.

2. The method of claim 1, wherein forming the mask pattern comprises:
   forming a photoresist layer over the hard mask patterns; and
   patterning the photoresist layer to expose the peripheral region using a photo-exposure and development process.

3. The method of claim 1, wherein the carbon-based material comprises an amorphous carbon or a carbon polymer.

4. The method of claim 1, wherein the carbon-based material is formed using a chemical vapor deposition (CVD) method.

5. The method of claim 1, wherein said trimming the hard mask patterns comprises using oxygen ($O_2$) or a plasma of a gas including $O_2$.

6. The method of claim 1, wherein said removing the mask pattern comprises performing a wet etch.

7. The method of claim 6, wherein the wet etch uses a solution including sulfuric acid ($H_2SO_4$) and hydrogen peroxide ($H_2O_2$).

\* \* \* \* \*